(12) United States Patent
Lemberg et al.

(10) Patent No.: US 10,903,834 B1
(45) Date of Patent: Jan. 26, 2021

(54) POWER ELECTRONIC DEVICE WITH PARALLELED TRANSISTORS

(71) Applicant: BAE Systems Controls Inc., Endicott, NY (US)

(72) Inventors: Nicholas A. Lemberg, Vestal, NY (US); Andrew S. Clark, Binghamton, NY (US); Thomas J. Cummings, Endwell, NY (US); Robert J. Vovos, Vestal, NY (US)

(73) Assignee: BAE Systems Controls Inc., Endicott, NY (US)

( * ) Notice: Subject to any disclaimer, the term of this patent is extended or adjusted under 35 U.S.C. 154(b) by 0 days.

(21) Appl. No.: 16/842,899

(22) Filed: Apr. 8, 2020

(51) Int. Cl.
*H03K 17/687* (2006.01)
*H05K 1/11* (2006.01)

(52) U.S. Cl.
CPC ......... *H03K 17/6871* (2013.01); *H05K 1/115* (2013.01); *H05K 2201/09309* (2013.01); *H05K 2201/1003* (2013.01); *H05K 2201/10166* (2013.01)

(58) Field of Classification Search
CPC ..... H03K 17/6871; H05K 2201/09309; H05K 2201/1003; H05K 2201/10166; H05K 1/115
USPC .... 327/108–112, 427, 434, 437; 326/82, 83, 326/87
See application file for complete search history.

(56) References Cited

U.S. PATENT DOCUMENTS

| | | | |
|---|---|---|---|
| 6,861,828 B2 | 3/2005 | Watanabe | |
| 7,298,123 B2 | 11/2007 | Watanabe et al. | |
| 7,936,210 B2 | 5/2011 | Robinson et al. | |
| 9,331,061 B2 * | 5/2016 | De Rooij | H01L 27/0207 |
| 9,525,413 B2 | 12/2016 | Roberts et al. | |
| 2005/0012541 A1 | 1/2005 | Watanabe | |
| 2016/0204252 A1 * | 7/2016 | Matsui | H01L 23/53228 327/109 |
| 2018/0302046 A1 | 10/2018 | Mitzlaff | |

OTHER PUBLICATIONS

Power Electronics, "Shootout vol. 5: Paralleling eGaN® FETs", Sep. 27, 2011, pp. 1-10, https://www.powerelectronics.com/technologies/gan-transistors/article/21859046/shootout-volume-5-paralleling-egan-fetspart-1.

(Continued)

*Primary Examiner* — Tomi Skibinski
(74) *Attorney, Agent, or Firm* — Scully Scott Murphy & Presser PC

(57) ABSTRACT

An electronic power device formed by a plurality of FETs formed on a circuit board formed of a plurality of layers, the plurality of transistors being formed on a first surface of the circuit board, the plurality of layers including a plurality of gate drive layers, a plurality of gate return layers, and a plurality of power layers. A gate drive circuit is formed on a second surface of the circuit board, the second surface being opposite the first surface, the gate drive circuit being connected to the gate and source of each of the plurality of transistors through the plurality of gate drive layers and the plurality of gate return layers. A voltage supply is connected to the drain of each of the plurality of transistors, the connections of the voltage supply to each of the plurality of transistors being interleaved through the plurality of power layers.

25 Claims, 10 Drawing Sheets

(56) References Cited

OTHER PUBLICATIONS

Power Electronics, "Shootout vol. 5: Paralleling eGaN® FETs", Sep. 27, 2011, pp. 1-7, https://www.powerelectronics.com/technologies/gan-transistors/article/21859428/shootout-volume-5-paralleling-egan-fets-part-2.

GaN Systems, GN001 Application Brief, "How to drive GaN Enhancement mode HEMT", Apr. 26, 2016, pp. 1-53.

Ramachandran, et al., "Effectively Paralleling GaN FETs to achieve Ultrahigh Efficiency in an Isolated DC-DC Converter", Fifth International Conference on Renewable Engergy and Applications, Nov. 20-23, 2016, pp. 1-5.

* cited by examiner

POWER ELECTRONIC DEVICE WITH PARALLELED TRANSISTORS

BACKGROUND

The present disclosure relates to power electronic devices having field effect transistors and more particularly, to power electronic devices having paralleled field effect transistors.

The use of paralleled field effect transistors (FETs) in electronic devices such as power converters is desirable to increase power performance and efficiency. However, challenges have developed in the development of paralleled FETs, particularly in applications that require a large amount of power, such as for electric and hybrid electric vehicles.

One prior art solution to parallel FET devices focused on preventing gate oscillations between parallel devices. The prior art addressed the problem of how to prevent the parasitic elements of a FET gate from oscillating within the gate structure. This solution ignores the power aspects of paralleling switches.

Another prior art solution to parallel FET devices focused on paralleling devices to act as a single switch. The problem solved within this prior art solution is how to make a single switch. This solution ignores the power needs of a power converter design structures such a half bridge or full bridge. The solution also ignores device to device commutation.

The prior art designs of parallel FET devices have not given consideration to how to parallel the devices to optimize the number of devices for a power converter in a high power application. These applications, such as for hybrid and electric vehicles, require large numbers of paralleled devices to meet the power need.

SUMMARY

One embodiment of the present disclosure is directed to an electronic power device formed by a plurality of transistors, each transistor having a gate, a source and a drain. In one embodiment, the plurality of transistors are FETs. The device is formed on a circuit board formed of a plurality of layers, the plurality of transistors being formed on a first surface of the circuit board, the plurality of layers including a plurality of gate drive layers, a plurality of gate return layers, and a plurality of power layers. A gate drive circuit is formed on a second surface of the circuit board, the second surface being opposite the first surface, the gate drive circuit being connected to the gate and source of each of the plurality of transistors through the plurality of gate drive layers and the plurality of gate return layers. A voltage supply is connected to the drain of each of the plurality of transistors, the connections of the voltage supply to each of the plurality of transistors being interleaved through the plurality of power layers.

In one embodiment of the electronic power device, the plurality of transistors form an H bridge circuit, each corner of the H bridge circuit having at least four of the plurality of transistors connected in parallel. In one embodiment, a voltage supply ground connections to the source of each of the plurality of transistors are interleaved through the plurality of power layers.

In one embodiment of the electronic power device, placement of the plurality of transistors forming the H bridge circuit are interleaved in a checkerboard pattern on the surface of the circuit board. In one embodiment, the voltage supply connections to the plurality of transistors forming opposite corners of the H bridge circuit are interleaved through the plurality of power layers.

In one embodiment of the electronic power device, a ferrite bead is connected in the path from the gate of each of the plurality of transistors to the gate drive circuit. In one embodiment, the ferrite bead has an ESR of about one ohm. In one embodiment, a resistor is connected in the gate return path from the source of each of the plurality of transistors to the gate drive circuit.

In one embodiment of the electronic power device, the circuit board includes at least two full lengths via extending through all of the plurality of layers of the circuit board and at least two blind vias extending through less than all of the plurality of layers of the circuit board. In one embodiment, the connections of the voltage supply to each of the plurality of transistors being interleaved through the plurality of power layers, through at least two of the at least two blind vias.

In one embodiment of the electronic power device, a separate gate drive circuit is provided for each of the plurality of transistors connected in parallel of each corner of the H bridge circuit. In one embodiment, the gate drive signal of each separate gate drive circuit is provided through a separate pair of gate drive layers and gate return layers.

BRIEF DESCRIPTION OF THE DRAWINGS

Further features as well as the structure and operation of various embodiments are described in detail below with reference to the accompanying drawings. In the drawings, like reference numbers indicate identical or functionally similar elements.

DETAILED DESCRIPTION

Figure 1:
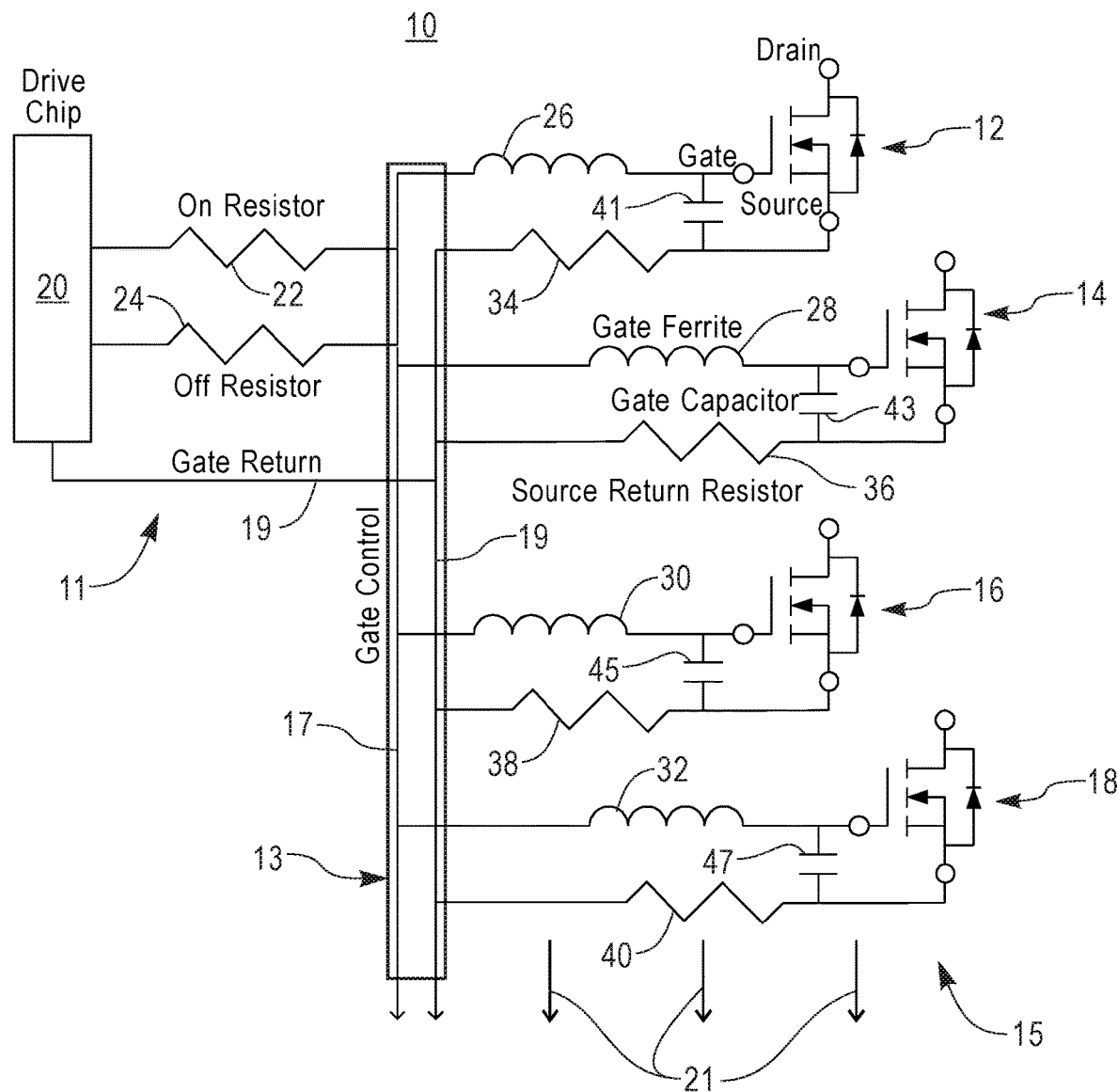
FIG. 1 is a diagram of a drive circuit on one side of a circuit board and a circuit connecting a plurality of FETs on the opposite side of the circuit board of one embodiment of an electronic power device disclosed in this specification.

FIG. 1 is a diagram of the gate drive circuitry of a FET device 10. The device 10 includes gate drive circuit 11 on one side of a circuit board 13 and FET circuit 15 located on the other side of the circuit board 13. The circuit 15 depicts the connections for connecting four FETSs 12, 14, 16 and 18 in parallel. The FETs may be formed of semiconductor materials such as, GaN, Ga$_2$O$_3$, GaAs, SiC and Si. The circuit 11 includes a gate drive chip 20 connected through on-resistor 22 and off-resistor 24 to the FETs 12, 14, 16 and 18 via by gate control signal lines 17 and gate return signal lines 19. The gate control signal lines 17 and gate return signal lines 19 are provided within parallel planes formed by the layers of the circuit board 13. Ferrite beads 26, 28, 30 and 32 are connected in the path from the gate of each FET, 12-18, respectively, to the drive chip 20. The ferrite beads 26-32 prevent oscillations between the gate drive circuit 11 and the parasitic capacitances that exist in the device 10. Resistors 34, 36, 38 and 40 are connected in the gate return path from the source of each FET 12-18, respectively, to the drive chip 20. In one optional embodiment, circuit 15 may include gate capacitors 41, 43, 45 and 47 connected between the gate and source of each transistor 12, 14, 16 and 18. The gate capacitors are used to absorb voltage spikes. The arrows on gate control path 17 and gate return path 19, along with the arrows 21 are meant to indicate that additional FETs may be connected together in parallel according to the present disclosure.

As will be described below, the connections from the gate drive chip 20 to the FETs 12-18 are interleaved within a plurality of layers forming the circuit board 13. The interleaving is accomplished by a combination of three different types of vias that extend perpendicular to the top and bottom surfaces of the circuit board that connect to a plurality of conductive layers of the circuit board 13. By interleaving the connections through the plurality of circuit board layers using the various types of perpendicular vias, the number of FETs that can be paralleled is not limited to the four devices shown in FIG. 1. The use of parallel planes in the gate path minimizes the parasitic inductance. This allows paralleling of multiple devices as the gate drive signal will remain undistorted due to parasitic inductance. The interleaving of the connections through the circuit board layers achieves proper current sharing between devices and minimizes the inductance within the commutation loop associated with switching the devices.

Figure 2:
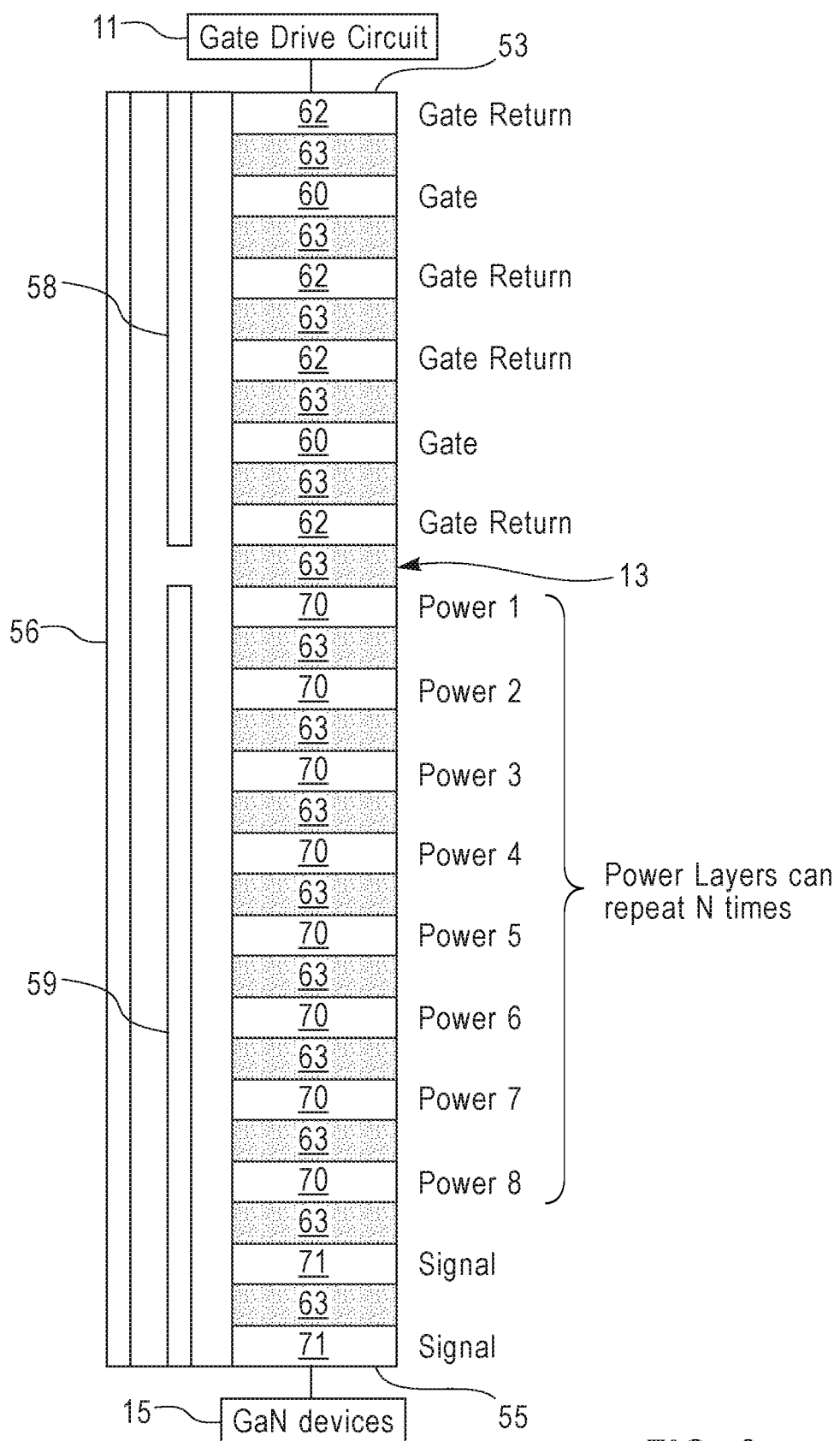
FIG. 2 is a diagram of the layers of a circuit board of one embodiment of an electronic power device disclosed in this specification.

FIG. 2 is a depiction of a side view of one embodiment of the circuit board 13. The circuit board 13 has the gate drive circuitry 11 located on the top surface 53 and the FET circuitry 15 are located on the bottom surface 55. It should be understood that the placement of the gate drive circuitry 11 and the FET circuitry 15 may be reversed. The circuit board 13 includes full length vias 56 that extend through all of the plurality of layers of the circuit board from the top surface 53 to the bottom surface 55. The circuit board 13 includes at least one blind via 58 extending from the top surface 53 having the gate drive circuitry 11 through a number of layers of the circuit board 13 needed to connect the gate drive circuit 11 to the gate and gate return signal parallel planes The circuit board 13 includes a plurality of conductive layers serving as gate drive layers 60 and gate return layers 62 forming the parallel planes for the gate control signal lines 17 and gate return signal lines 19. The gate drive layers 60 and gate return layers 62 are separated by insulator layers 63. The gate drive circuitry 11 is connected using the blind vias 58 to the gate drive layers 60 and gate return layers 62. The gate drive layers 60 and gate return layers 62 extend into the parallel planes of the circuit board 13 for providing the gate control signal lines 17 and gate return signal lines 19.

Full vias 56 are used to connect the gate control signal lines 17 and gate return signal lines 19 to the FET circuitry 15. In the embodiment shown in FIG. 2, there are two gate return layers for each gate drive layer. The gate return layer on each side of the gate drive layer provides extra shielding of the gate drive layer. In another embodiment, a single gate return layer may be provided for each gate drive layer.

Figure 3:
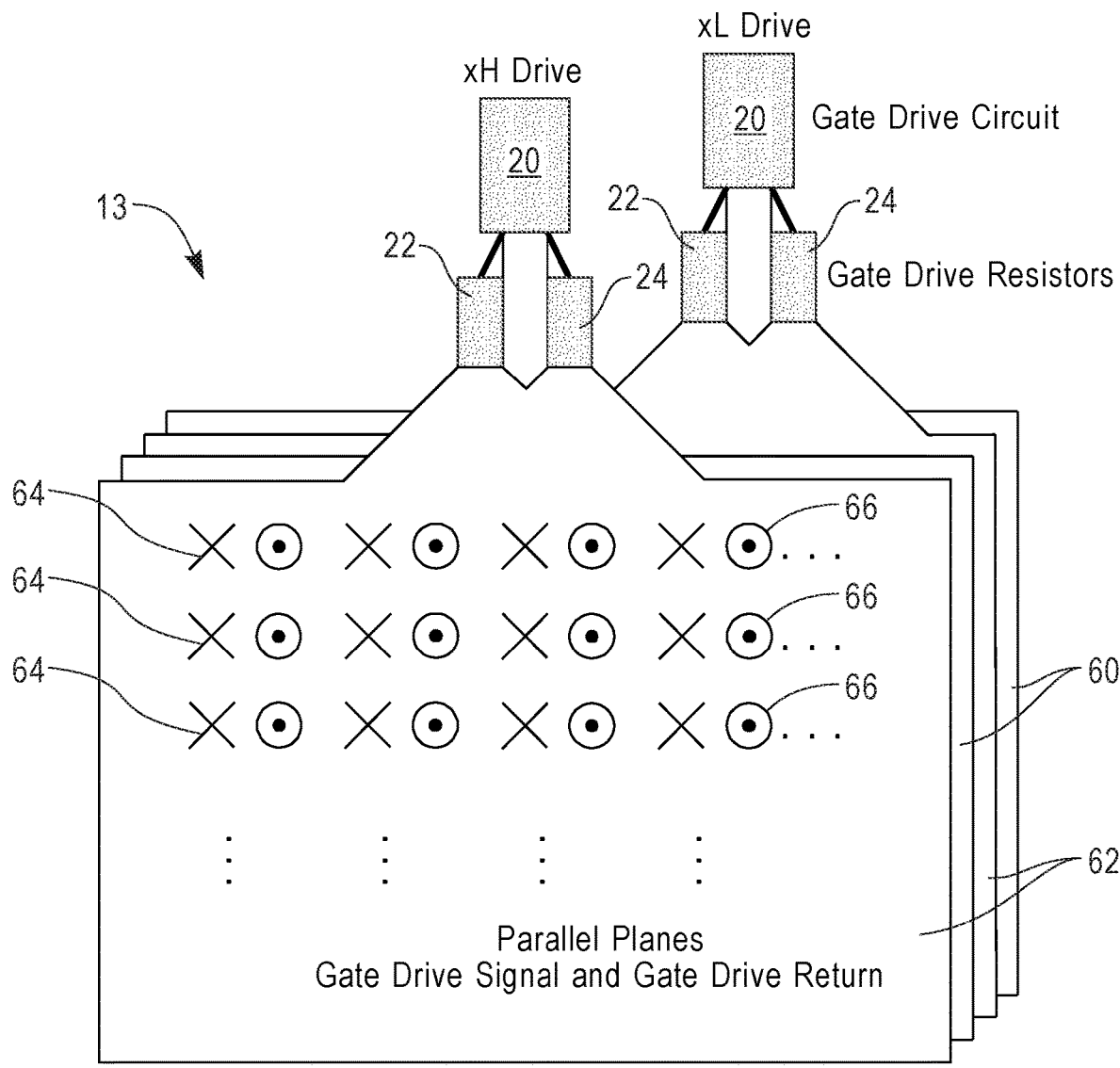
FIG. 3 is an exploded top view of circuit board showing the top gate drive and gate return layers of a circuit board of one embodiment of an electronic power device disclosed in this specification.

FIG. 3 depicts a top view of the circuit board 13 showing parallel planes provided by the gate layers 60 and gate return layers 62. The gate layers 60 and gate return layers 62 are used to distribute the gate drive signal from the gate drive circuit 20 through the gate drive resistors 22 and 24. In the embodiment shown in FIG. 3, two drive chip circuits 20 and corresponding drive chip resistors 22 and 24 are provided. Each drive circuit uses a gate layer 60 and a gate return layer 62. Dedicated vias for each FET in the FET circuit 15 connect the individual devices to the gate drive layers 60 and the gate return layers 62. The Xs 64 represent vias for the gate return signal and the dots represent vias for the gate control signal.

Returning now to FIG. 2, the circuit board 13 also contains layers 70 for delivering power to the FETs of the circuit 15. The circuit board 13 may include signal layers 71 for use by other components on the circuit board. Four power layers 70, numbered 1-4, connect FETs that are connected in parallel. A second group of four power layers 70, numbered 5-8, may also be provided if needed to obtain the desired current capability. The groups of four power layers 70 can repeat as many times as necessary to obtain the desired current capability. Blind vias 59 are used to connect the individual FETs in circuit 15 to power layers 70. Providing the gate drive layers 60 and gate return layers 62 on the upper half of the thickness of the circuit board 13 and the power layers on the lower half of the thickness of the circuit board 13 keeps power routing through layers 70 closer to the devices in circuit 15.

Figure 4:
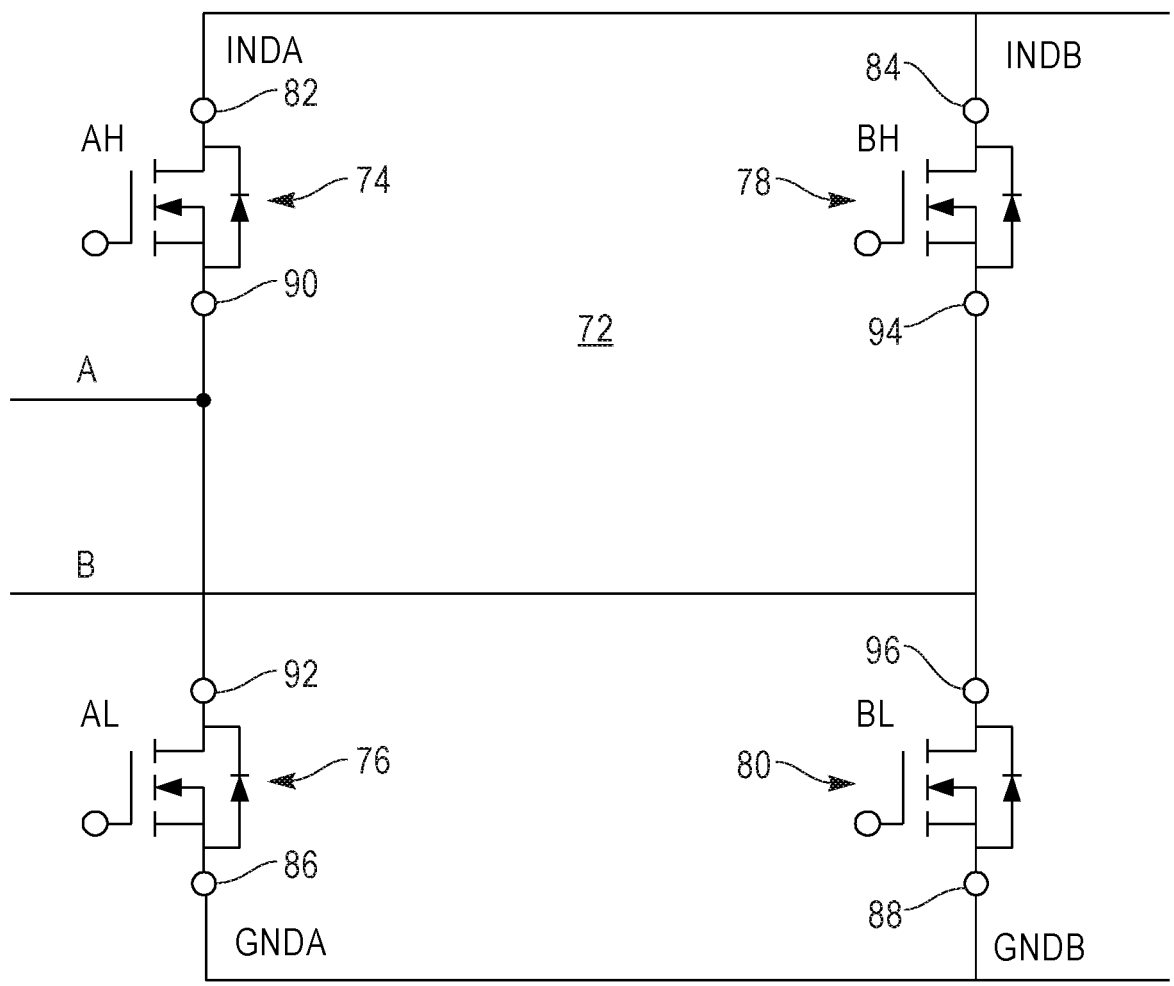
FIG. 4 is a schematic diagram of one embodiment of an H bridge circuit of one embodiment of an electronic power device invention disclosed in this specification.

FIG. 4 is a schematic diagram of one embodiment of an H bridge circuit 72 having four FETs 74, 76, 78 and 80. FET 72, designated AH, is on the left high side of the bridge. FET 78, designated BH, is on the right high side of the bridge. FET 76, designated AL, is on the left low side of the bridge. FET 80, designated BL, is on the right low side of the bridge. Input signal INDA is connected to the drain 82 of device 74. Input signal INDB is connected to the drain 84 of device 78. Ground signal GNDA is connected to the source 86 of device 76. Ground signal GNDB is connected to the source 88 of device 80. Output signal line A is connected to the source 90 of device 74 and the drain 92 of device 76. Output signal line B is connected to the source 94 of device 78 and the drain 96 of device 80.

Figure 5:
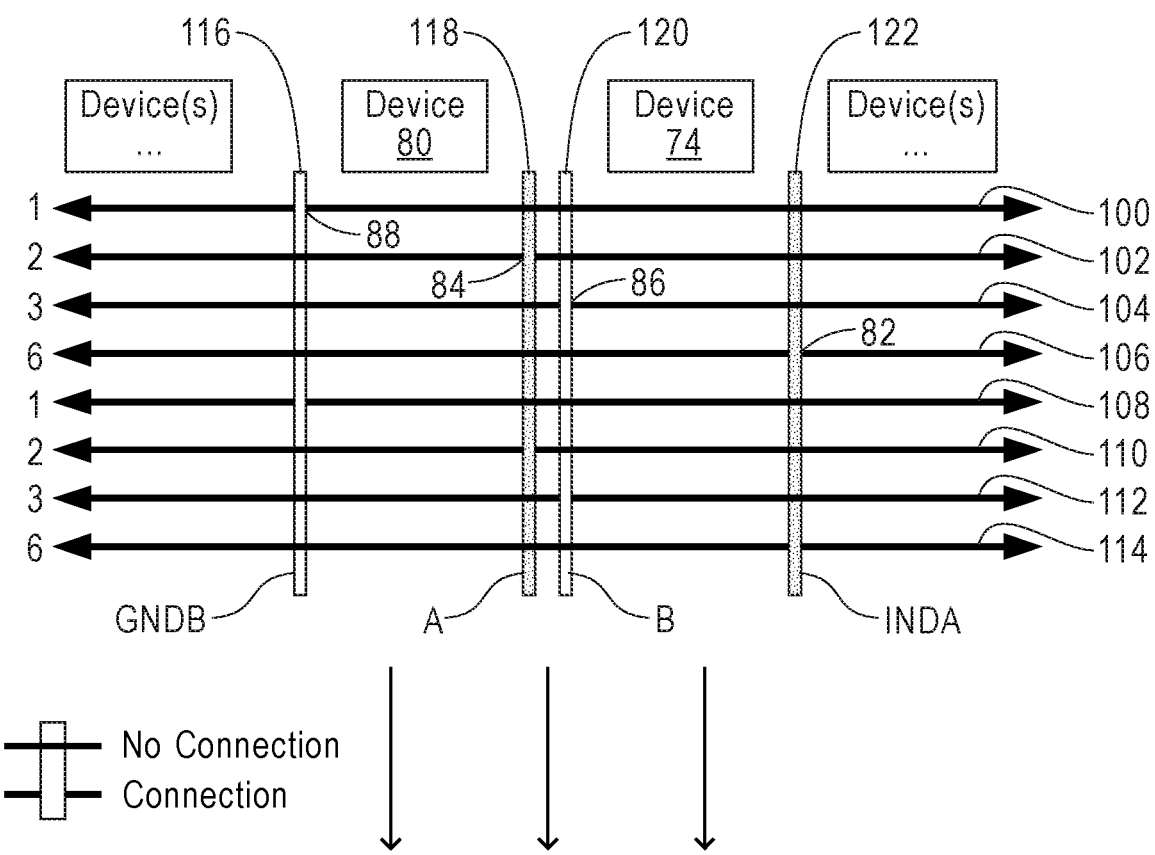
FIG. 5 is a diagram of the connections of the power layers to the vias of a circuit board of one embodiment of an electronic power device invention disclosed in this specification.

FIG. 5 depicts one embodiment of the planar routing of the power layers 70 for the AH FET 74 and the BL FET 80 of the H bridge 72 of FIG. 4. Each of the circuit board layers 70 has a corresponding one of the conductor traces 100-114. The connections to the power input and ground of the FETs are interleaved through the blind vias 59 (see FIG. 2) cutting across the planes of the layers 70. In FIG. 5, vias 59 includes vias 116, 118, 120 and 122. Via 116 connects the ground GNDB of device 80 at connection 88. Via 118 connects the power input B of device 80 at connection 96. Via 120 connects the power input A of device 74 at connection 90. Via 122 connects the power input INDA of device 74 at connection 82. The current capability is dependent on the number of copper layers and the thickness of the copper layers connected to the respective devices.

In one embodiment, the supply voltage connections to the opposing corners of the H bridge circuit 72 are interleaved within the layers of the circuit board. The interleaving of the FET devices associated with opposing corners of an H bridge (Left High with Right Low and Right High with Left Low) minimizes the parasitic inductance and maximizes magnetic field cancellation. When this field is cancelled and the inductance is minimized the on resistance of the device becomes the dominate mechanism for sharing and the current sharing balances due to the relationship of on resistance and device heating. The hotter the device the higher the resistance and the lower the current, once thermally stabilized the parallel devices balance.

Figure 6:
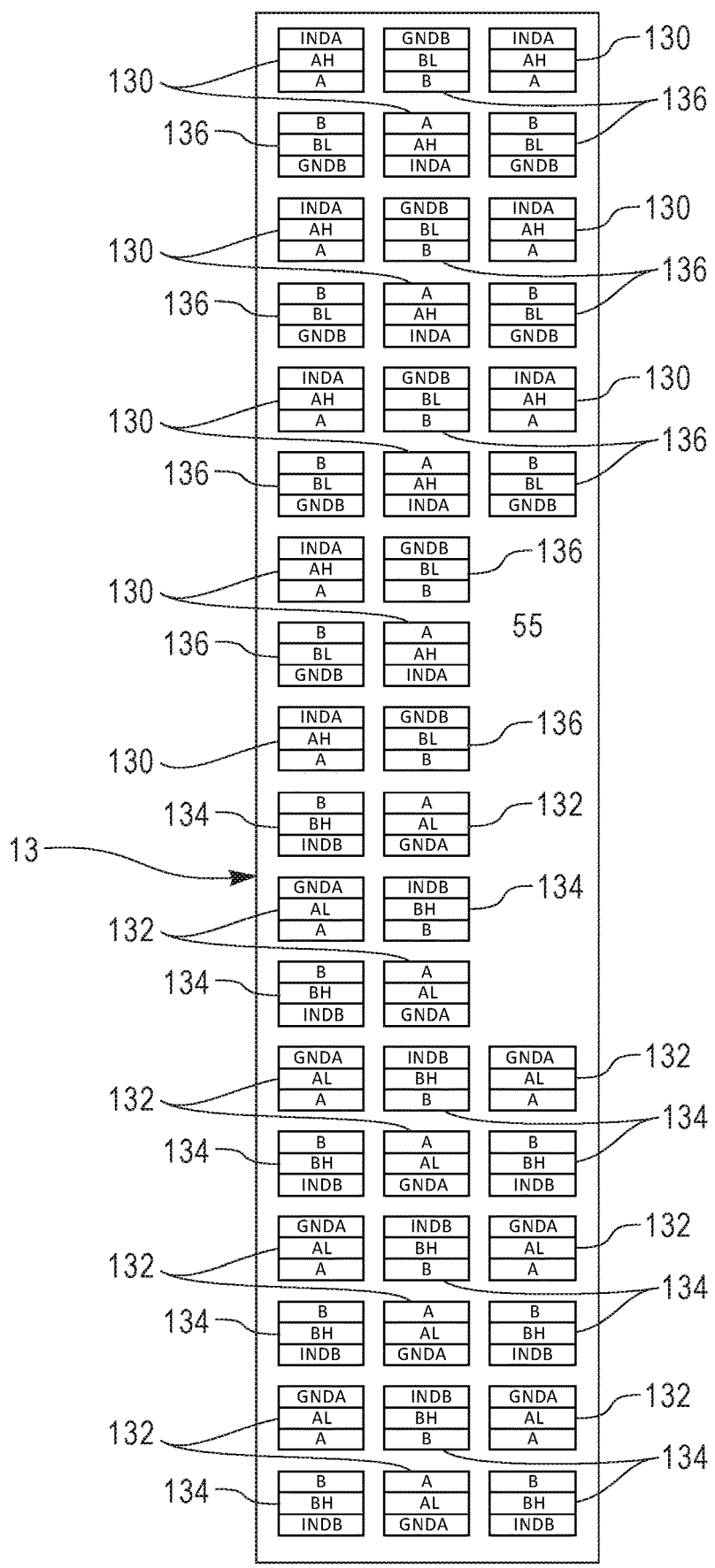
FIG. 6 is a bottom view of a circuit board showing the checkerboard placement of the FETs forming an H bridge circuit of one embodiment of an electronic power device invention disclosed in this specification.

FIG. 6 is a view of the bottom surface 55 of one embodiment of the circuit board 13 showing a checkerboard layout of forty eight FETs used to form the H bridge circuit of FIG. 3. There are four sets of twelve FET devices connected in parallel. There are twelve FET devices 130 labeled AH. The twelve devices 130 are paralleled on the surface 55 using the circuit 15 of FIG. 1, to form device 74 of FIG. 4. There are twelve FET devices 132 labeled AL. The twelve devices 132 are paralleled to form device 76 of FIG. 4. There are twelve FET devices 134 labeled BH. The twelve devices 134 are paralleled to form device 78 of FIG. 4. There are twelve FET devices 136 labeled BL. The twelve devices 136 are paralleled to form device 80 of FIG. 4.

The layout of FIG. 6 shows one embodiment in which the plurality of the FETs AH, BH, AL and BL of the H bridge circuit of FIG. 4 are interleaved in a checkerboard pattern on the surface 55 of the circuit board 13. In this layout, the AH and BL devices are alternately placed next to each other in the upper half of the board as viewed in FIG. 6. The AL and BH devices are alternately placed next to each other in the lower half of the board as viewed in FIG. 6. The number of rows of devices and the number of devices in each row is variable depending on the required capabilities of the resultant design.

In one embodiment, a single gate drive circuit 20 as shown in FIG. 1 is used to drive all twelve of the FET devices forming each corner of the H bridge circuit of FIG. 4. The single drive circuit ensures that the time delay between the devices being switched is minimized. Use of a single circuit to drive all the devices removes time delay differences between parallel driving circuits. Any remaining time delay differences are due to mismatch in gate drive length. The central placement of the gate drive circuit within the gate drive structure will minimize the mismatch in gate drive length. The common gate drive circuit helps achieve proper current sharing between the devices. The use of parallel planes can compensate for offset in placement of the gate drive circuit by minimizing the inductance of the gate paths.

Some prior art solutions have used both a small ferrite bead (Z10-20 ohms) and a gate resistor in the path from the gate of each FET to the drive chip. In one embodiment of the present disclosure, the ferrite bead with high equivalent series resistance (ESR) replaces the gate resistor. A high ESR for a high power application is about 1 ohm. The purpose is to replicate the function of a traditional gate resistor which has a resistance rating in this range (dependent on application it will vary). For example, in an application for a power converter for an EV or HEV, the 1 ohm gate resistance is sufficient and is achieved using the ESR of the ferrite bead in place of the dedicated gate resistance.

A ferrite bead prevents oscillations between the gate drive circuit and the parasitic capacitances of the device. The use of a ferrite bead with high ESR without an additional gate resistor is an improvement over the prior art solutions because it requires fewer components than the combination of a ferrite bead in series with a gate resistor.

In one embodiment, a source return resistor is placed in the source return path. Roughly 40% of total gate resistance goes in the source return path. A source return resistor placed in the source return path prevents oscillation between gates of parallel devices more so than oscillation between gates and the corresponding gate drive chip.

Figure 7:
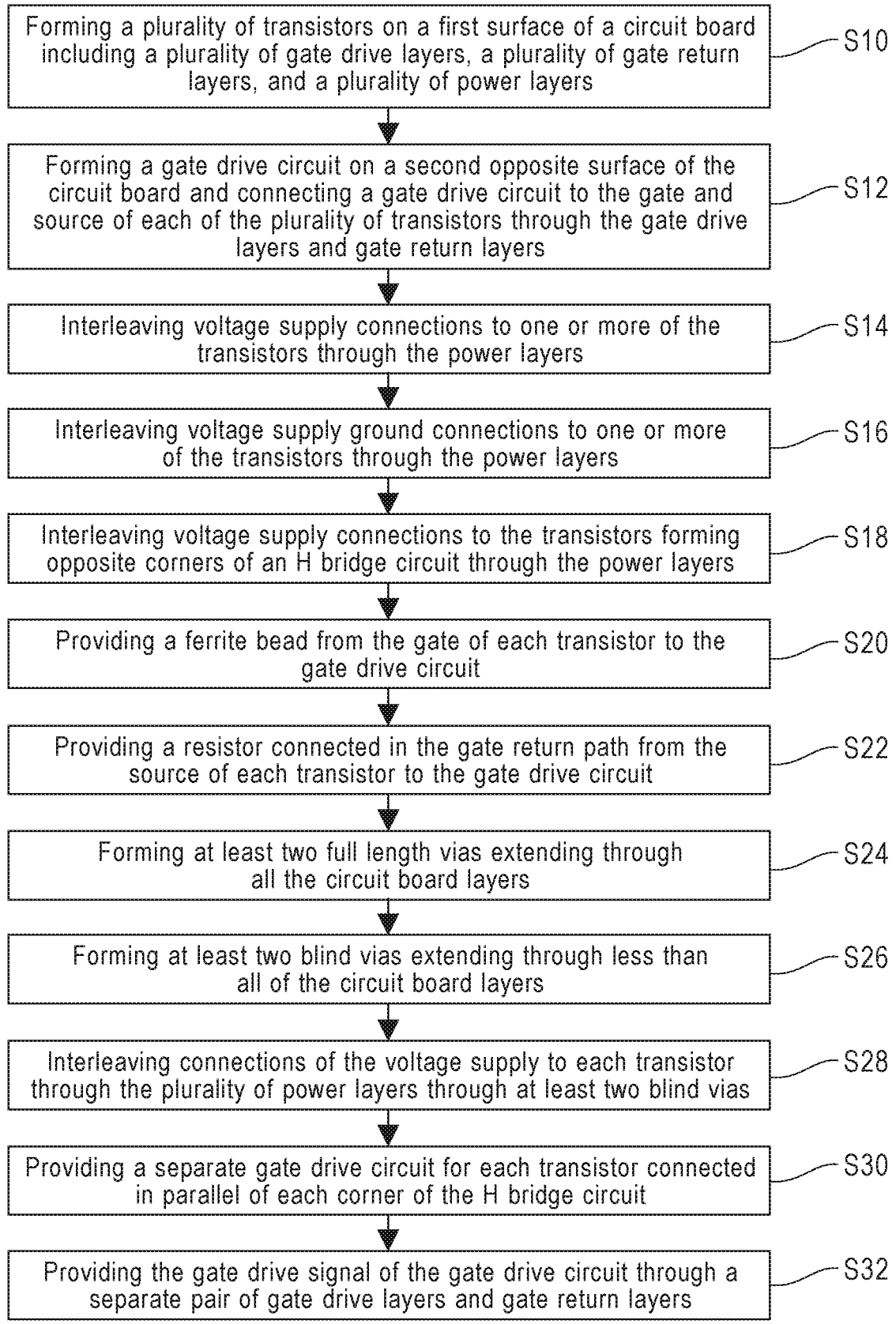
FIG. 7 is a flow diagram of one embodiment of a method forming an electronic power device of the present disclosure.

FIG. 7 is a flow diagram of one embodiment of a method of forming an electronic power device. The method starts with step S10 of forming a plurality of transistors, each transistor having a gate, a source and a drain on a first surface of a circuit board, the circuit board having a plurality of layers, the plurality of layers including a plurality of gate drive layers, a plurality of gate return layers, and a plurality of power layers. Step S10 may include forming the plurality of transistors in an H bridge circuit, each corner of the H bridge circuit having at least four of the plurality of transistors connected in parallel. Step S10 may include interleaving the placement of the plurality of transistors forming the H bridge circuit in a checkerboard pattern on the surface of the circuit board.

The flow moves to step S12 of forming a gate drive circuit on a second surface of the circuit board, the second surface being opposite the first surface, the gate drive circuit being connected to the gate and source of each of the plurality of transistors through the plurality of gate drive layers and the plurality of gate return layers. The flow then moves to step S14 of connecting a voltage supply to the drain of one or more of the plurality of transistors, the connections of the voltage supply to each of the plurality of transistors being interleaved through the plurality of power layers.

The flow may include step S16 interleaving voltage supply ground connections to the source of one or more of the plurality of transistors through the plurality of power layers. In the case where the plurality of transistors form an H bridge circuit, in step S14 the voltage supply is only in contact with the drain of the upper transistors of the H bridge and in step S16 the voltage supply ground is only in contact with the source of the lower transistors of the H bridge. The flow may also include step S18 of interleaving the voltage supply connections to the plurality of transistors forming opposite corners of the H bridge circuit through the plurality of power layers.

The flow may include step S20 of providing a ferrite bead connected in the path from the gate of each of the plurality of transistors to the gate drive circuit. Step S20 may include providing the ferrite bead with an ESR of about one ohm. The flow may include step S22 of providing a resistor connected in the gate return path from the source of each of the plurality of transistors to the gate drive circuit.

The flow may include step S24 of forming at least two full length vias extending through all of the plurality of layers of the circuit board. The flow may include step S26 of forming at least two blind vias extending through less than all of the plurality of layers of the circuit board. The flow may include step S28 of interleaving the connections of the voltage supply to each of the plurality of transistors through the plurality of power layers, through at least two of the at least two blind vias.

The flow may include step S30 of providing a separate gate drive circuit for each of the plurality of transistors connected in parallel of each corner of the H bridge circuit. The flow may include step S32 of providing the gate drive signal of each separate gate drive circuit through a separate pair of gate drive layers and gate return layers.

Figure 8:
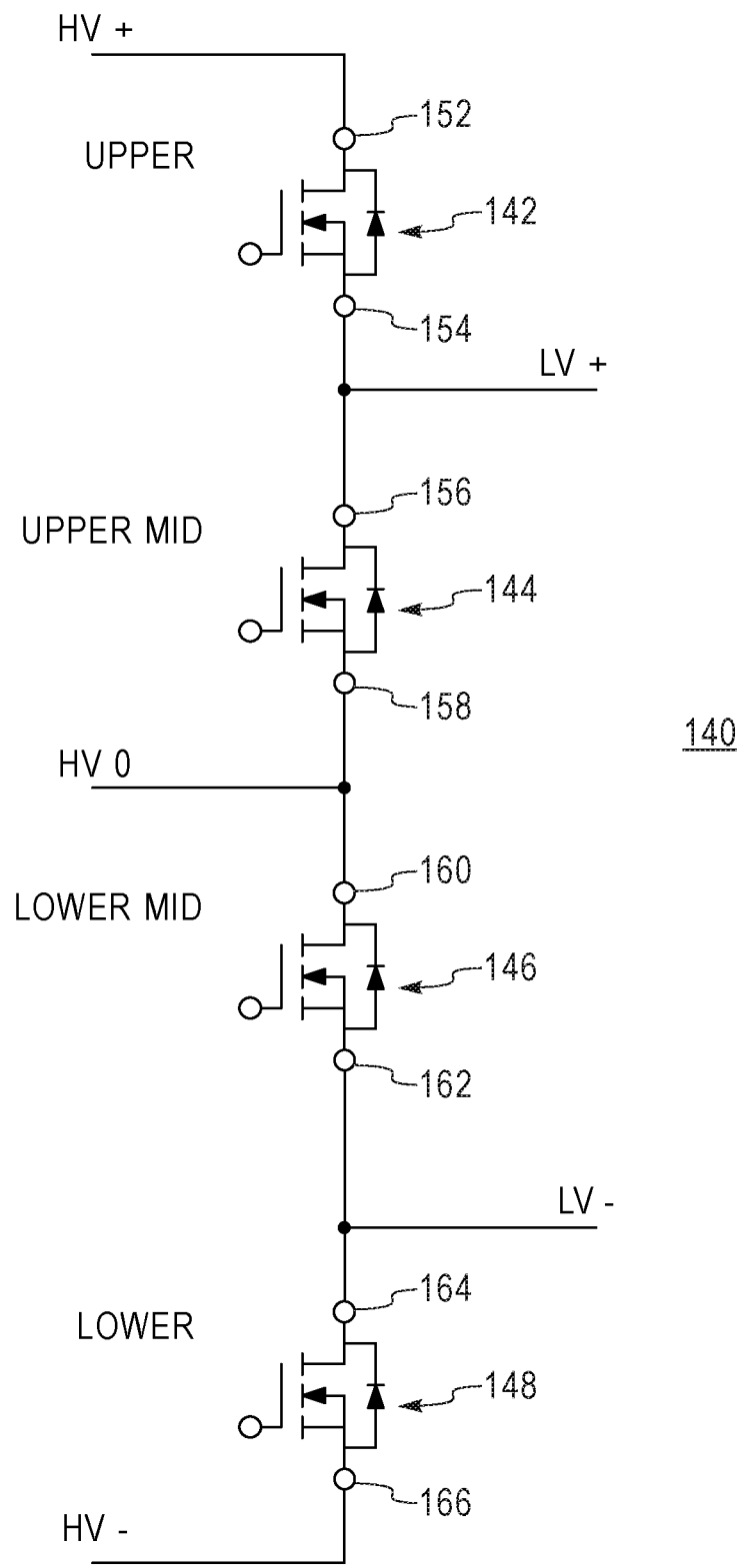
FIG. 8 is a schematic diagram of one embodiment of an H bridge circuit of one embodiment of a multilevel converter disclosed in this specification.

FIG. 8 is a schematic diagram of one embodiment of a multilevel converter having four FETs 142, 144, 146 and 148. FET 142 is in the upper position of the bridge and FET 144 is in the upper mid position of the bridge. FET 146 is in the lower mid position of the bridge and FET 148 is in the lower position of the bridge. Input signal HV+ is connected to the drain 152 of FET 142. Input signal LV+ is connected to the source 154 of FET 142 and to the drain 156 of FET 144. Input signal LV− is connected to the source 162 of FET 146 and to the drain 164 of FET 148. Input signal HV− is connected to the source 166 of FET 148. Output signal line HV O is connected to the source 158 of FET 144 and the drain 160 of FET 146.

Figure 9:
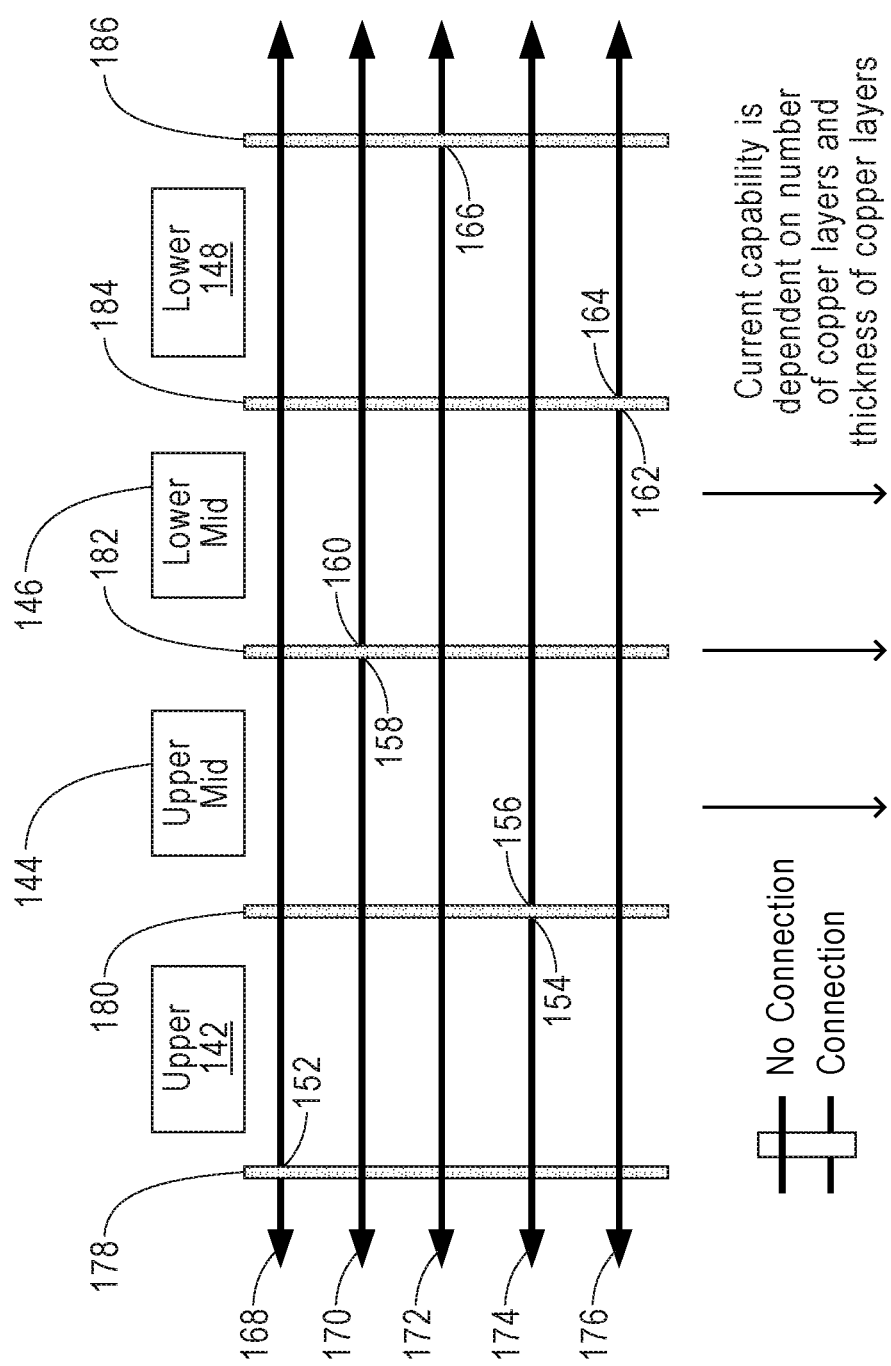
FIG. 9 is a diagram of the connections of the power layers to the vias of a circuit board of one embodiment of the multilevel converter disclosed in this specification.

FIG. 9 depicts one embodiment of the planar routing of five power layers 168-176 for FETS 142, 144, 146 and 148 of the circuit 140 of FIG. 8. The connections to the FETs are interleaved through the blind vias 178, 180, 182, 184 and 186 cutting across the planes of the power layers 168-176. Via 178 connects the input HV+ of device 142 at connection 152. Via 180 connects the input LV+ to devices 142 and 144 at connections 154 and 156. Via 182 connects the output HV O from devices 144 and 146 at connections 158 and 160. Via 184 connects the input LV− to devices 146 and 148 at connections 162 and 164. Via 186 connects the input HV− to device 148 at connection 166.

Figure 10:
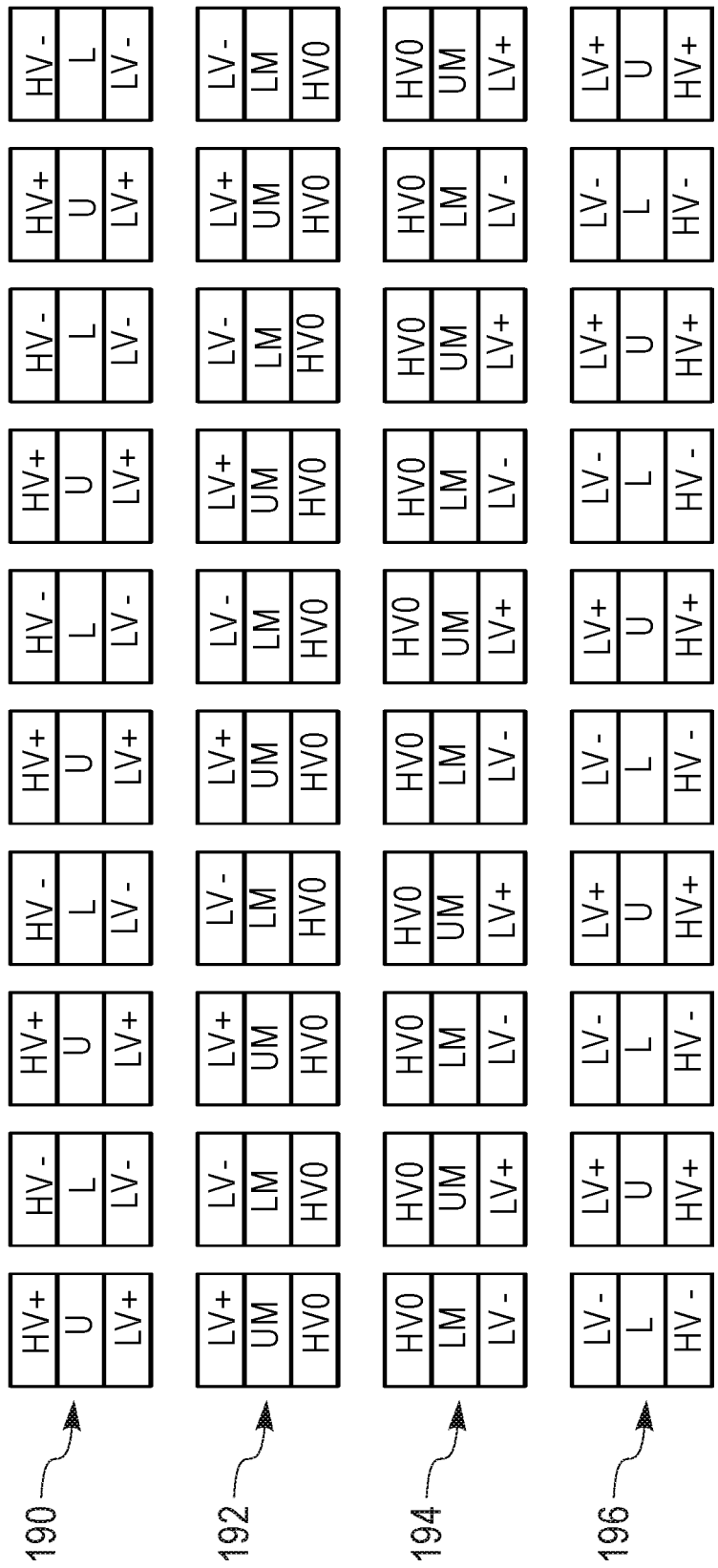
FIG. 10 is a bottom view of a circuit board showing the checkerboard placement of the FETs forming an H bridge circuit of one embodiment of the multilevel converter disclosed in this specification.

FIG. 10 is a view of the bottom surface of one embodiment of the circuit board showing a checkerboard layout of forty FETs used to form the circuit of FIG. 8. There are four sets of ten FET devices connected in parallel. There are ten upper devices marked U connected in parallel. There are ten lower devices marked L connected in parallel. There are ten upper mid devices marked UM connected in parallel. There are ten lower mid devices marked LM connected in parallel. The layout of FIG. 10 shows one embodiment in which the plurality of the FETs U, L, UM and LM of the H bridge circuit of FIG. 8 are interleaved in a checkerboard pattern on the surface of the circuit board. In this layout, U and L devices are alternately placed next to each other in a first row 190 of the circuit board, with a U device being first in the row. The UM and LM devices are alternately placed next to each other in a second row 192 of the circuit board with the UM device being first in the row. The UM and LM devices are alternately placed next to each other in a third row 194 of the circuit board the UL device being first in the row. The U and L devices are alternately placed next to each other in a fourth row 196 of the circuit board, with a L device being first in the row.

The Upper devices 142, Upper Mid devices 144, Lower Mid devices 146 and Lower devices 148 are layered out, as shown in FIGS. 9 and 10, in such a way that maximum field cancellation is achieved thereby ensuring good balance and proper paralleling. The planer nature of the power layers will minimize parasitic inductance within the commutation loop (s) of the multilevel converter.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An electronic power device comprising:
    a plurality of transistors, each transistor having a gate, a source and a drain,
    a circuit board formed of a plurality of layers, the plurality of transistors being formed on a first surface of the circuit board, the plurality of layers including a plurality of gate drive layers, a plurality of gate return layers, and a plurality of power layers;
    a gate drive circuit formed on a second surface of the circuit board, the second surface being opposite the first surface, the gate drive circuit being connected to the gate and source of each of the plurality of transistors through the plurality of gate drive layers and the plurality of gate return layers; and
    a voltage supply connected to the plurality of transistors, the connections of the voltage supply to each of the plurality of transistors being interleaved through the plurality of power layers.

2. The electronic power device of claim 1, wherein the plurality of transistors form an H bridge circuit, each corner of the H bridge circuit having at least four of the plurality of transistors connected in parallel.

3. The electronic power device of claim 2, wherein placement of the plurality of transistors forming the H bridge circuit are interleaved in a checkerboard pattern on the surface of the circuit board.

4. The electronic power device of claim 2, wherein the voltage supply connections to the plurality of transistors forming opposite corners of the H bridge circuit are interleaved through the plurality of power layers.

5. The electronic power device of claim 2, further including a separate gate drive circuit for each of the plurality of transistors connected in parallel of each corner of the H bridge circuit.

6. The electronic power device of claim 5, wherein the gate drive signal of each separate gate drive circuit is provided through a separate pair of gate drive layers and gate return layers.

7. The electronic power device of claim 1, wherein a voltage supply ground connections to the source of each of the plurality of transistors are interleaved through the plurality of power layers.

8. The electronic power device of claim 1, wherein the plurality of transistors are FETS fabricated from semiconductor materials selected from the group consisting of GaN, SiC, Si, GaAs and GaO.

9. The electronic power device of claim 1, further including a ferrite bead connected in the path from the gate of each of the plurality of transistors to the gate drive circuit.

10. The electronic power device of claim 9, wherein the ferrite bead has an ESR of about one ohm.

11. The electronic power device of claim 9, further including a resistor connected in the gate return path from the source of each of the plurality of transistors to the gate drive circuit.

12. The electronic power device of claim 1, wherein the circuit board includes at least two full length via extending through all of the plurality of layers of the circuit board and at least two blind vias extending through less than all of the plurality of layers of the circuit board.

13. The electronic power device of claim 12, wherein the connections of the voltage supply to each of the plurality of transistors being interleaved through the plurality of power layers, through at least two of the at least two blind vias.

14. A method of forming an electronic power device comprising:
    forming a plurality of transistors, each transistor having a gate, a source and a drain on a first surface of a circuit board, the circuit board having a plurality of layers, the plurality of layers including a plurality of gate drive layers, a plurality of gate return layers, and a plurality of power layers;

forming a gate drive circuit on a second surface of the circuit board, the second surface being opposite the first surface, the gate drive circuit being connected to the gate and source of each of the plurality of transistors through the plurality of gate drive layers and the plurality of gate return layers; and connecting a voltage supply to the plurality of transistors, the connections of the voltage supply to each of the plurality of transistors being interleaved through the plurality of power layers.

15. The method of claim 14, wherein the plurality of transistors form an H bridge circuit, each corner of the H bridge circuit having at least four of the plurality of transistors connected in parallel.

16. The method of claim 15, wherein placement of the plurality of transistors forming the H bridge circuit are interleaved in a checkerboard pattern on the surface of the circuit board.

17. The method of claim 15, wherein the voltage supply connections to the plurality of transistors forming opposite corners of the H bridge circuit are interleaved through the plurality of power layers.

18. The method of claim 15, further including providing a separate gate drive circuit for each of the plurality of transistors connected in parallel of each corner of the H bridge circuit and the gate drive signal of each separate gate drive circuit is provided through a separate pair of gate drive layers and gate return layers.

19. The method of claim 14, wherein voltage supply ground connections to the source of each of the plurality of transistors are interleaved through the plurality of power layers.

20. The method of claim 14, wherein the plurality of transistors are GaN FETs.

21. The method of claim 14, further including providing a ferrite bead connected in the path from the gate of each of the plurality of transistors to the gate drive circuit.

22. The method of claim 21, wherein the ferrite bead has an ESR of about one ohm.

23. The method of claim 21, further including providing a resistor connected in the gate return path from the source of each of the plurality of transistors to the gate drive circuit.

24. The method of claim 14, wherein the circuit board includes full length via extending through all of the plurality of layers of the circuit board blind vias extending through less than all of the plurality of layers of the circuit board.

25. The method of claim 24, wherein the connections of the voltage supply to each of the plurality of transistors being interleaved through the plurality of power layers, through at least two of the at least two blind vias.

* * * * *